United States Patent [19]

Takaya

[11] Patent Number: 4,730,241

[45] Date of Patent: Mar. 8, 1988

[54] LAMINATED HYBRID INTEGRATED DC-DC CONVERTER

[75] Inventor: Minoru Takaya, Tokyo, Japan

[73] Assignee: TDK Corporation, Tokyo, Japan

[21] Appl. No.: 40,688

[22] Filed: Apr. 17, 1987

Related U.S. Application Data

[63] Continuation of Ser. No. 760,017, Jul. 29, 1985, abandoned.

[30] Foreign Application Priority Data

Jul. 27, 1984 [JP] Japan ............................ 59-113453[U]

[51] Int. Cl.$^4$ .......................................... H02M 3/338
[52] U.S. Cl. ...................................... 363/19; 336/200; 361/401; 363/147
[58] Field of Search ........................ 363/15, 16, 18, 19, 363/60, 147; 361/400, 401; 336/200, 232

[56] References Cited

U.S. PATENT DOCUMENTS

| | | | |
|---|---|---|---|
| 3,714,530 | 1/1973 | Wells et al. ............................. | 363/60 |
| 4,080,585 | 3/1978 | Molthen .............................. | 336/200 |
| 4,322,698 | 3/1982 | Takahashi et al. .................... | 336/200 |
| 4,342,143 | 8/1982 | Jennings .............................. | 336/200 |
| 4,355,277 | 10/1982 | Davis et al. .......................... | 323/351 |
| 4,622,627 | 11/1986 | Rodriguez et al. ................. | 363/147 |

FOREIGN PATENT DOCUMENTS

| 3341785 | 6/1985 | Fed. Rep. of Germany ........ | 363/19 |
|---|---|---|---|
| 45985 | 3/1984 | Japan ................................... | 323/282 |

*Primary Examiner*—William H. Beha, Jr.
*Attorney, Agent, or Firm*—Seidel, Gonda, Goldhammer & Abbott

[57] ABSTRACT

A DC-DC converter of a laminated, hybrid integrated type comprising a laminated transformer having printed conductor layers on its surface and electronic components attached to the surface. The laminated transformer is formed by alternately laminating a plurality of insulator layers and two sets of conductor layers insulated from each other. The conductor layers are connected at ends to constitute primary and secondary wirings in an inter-layer formation. The laminated transformer has a glass undercoat formed thereon or a laminated capacitor deposited on its surface to provide a base for the other electronic components.

3 Claims, 13 Drawing Figures

LAMINATED HYBRID INTEGRATED DC-DC CONVERTER

This is a continuation of co-pending application Ser. No. 760,017, filed July 29, 1985, now abandoned.

BACKGROUND OF THE INVENTION

This invention relates to a DC-DC converter, and more specifically to a DC-DC converter of a laminated, hybrid integrated type.

Conventional DC-DC converters, being used in varied types of electronic equipment including communication system units, comprise a printed circuit board or an alumina baseboard as the printed board and resistors, capacitors, diodes, and other devices attached to the board surface. The transformer for use with such a converter is relatively large in size and requires a baseboard large enough for it, along with the other components, to be mounted thereon. The transformer has therefore hampered the size reduction of DC-DC converters.

It is an object of the present invention to provide a DC-DC converter smaller in size than the existing ones.

Another object is to provide a simplified process for the fabrication of the DC-DC converter.

SUMMARY OF THE INVENTION

The DC-DC converter of the invention is characterized in that it employs a laminated transformer as its printed board, with a glass layer formed thereon when necessary, and attaches the rest of electronic components to the board surface. In a preferred embodiment, a capacitor part is built as a laminated capacitor superposed compositely on the laminated transformer, and the whole laminate is used as a printed board on which the remaining electronic parts are mounted.

This construction utilizes the transformer part of relatively large volume as a printed board, completely dispensing with the conventional baseboard such as of alumina. The invention thus makes possible material size reduction of the objective converter and also simplification of its fabrication process.

DETAILED DESCRIPTION OF THE INVENTION

DC-DC converters function to convert a direct-current input into an alternating-current output by an oscillator and rectify the latter back to a direct-current output. To this end each DC-DC converter uses a transformer as part of the oscillator. In addition, it employs a transistor for oscillation, rectifying diode, smoothing capacitor, and devices for stabilizing input and output levels, such as zener diode, transistor, capacitor, and resistor for those purposes. The laminated transformer part to be used occupies a rather larger space than the other parts. According to this invention, therefore, the laminate of insulating magnetic layers is utilized as a printed board and, if necessary, the top laminate surface is covered with a glass layer. The remainder of electronic parts is all attached to the laminated transformer surface for packaging.

Under the invention, the laminated transformer is built by lamination of layers of an electrically insulating magnetic ferrite powder paste and fine conductor strips of a metal powder paste by the well-known printing technique, and by subsequent high-temperature sintering of it to an integral laminated transformer.

The fabrication of an embodiment of the invention will now be described in detail.

Figure 1:
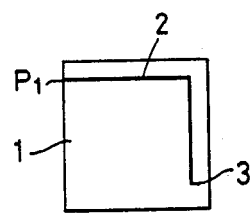
FIGS. 1 through 8 are plan views illustrating the sequence of steps for the fabrication of a laminated transformer in accordance with the present invention.
Figure 6:
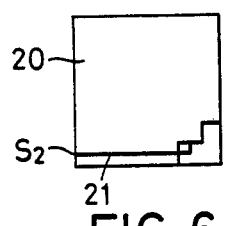
Figure 2:
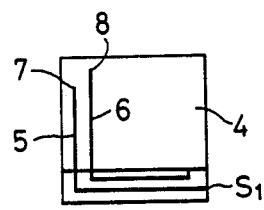
Figure 7:
Figure 3:
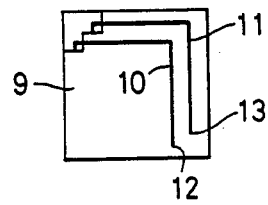
Figure 4:
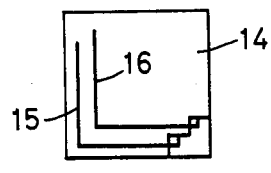
Figure 5:
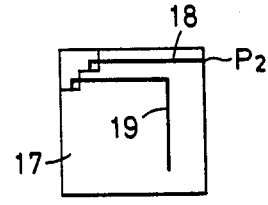

First, as shown in FIG. 1, a magnetic layer 1 is formed and a conductor 2 to constitute part of primary winding is printed in an inverted-L pattern onto the layer. One end $P_1$ of the conductor 2 is led out at an edge of the magnetic layer 1. In the next step depicted in FIG. 2, another magnetic layer 4 is deposited by printing to cover the conductor 2 except for its other end 3. Then, a conductor 5 having a lead-out end $S_1$ and which constitutes part of secondary winding is printed in a letter L pattern onto the layer 4 while, at the same time, another conductor 6 is printed likewise as extended continuously from the end 3 of the conductor 2. The fabrication proceeds to the step of FIG. 3, where a magnetic layer 9 is deposited by printing, leaving the upper left corner of the underlying layer uncovered to expose only the ends 7, 8 of the conductors 5, 6, respectively. L-shaped conductors 10, 11 are then printed onto this layer as extending from the points 7, 8. As in FIG. 4, a magnetic layer 14 is deposited by printing to cover the entire surface of the underlying layer excepting the ends 12, 13 of the conductors 10, 11, and L-shaped conductors 15, 16 are formed by printing as connected to the ends 12, 13 of the immediately preceding conductors. In the ensuing step of FIG. 5, a magnetic layer 17 similar to the layer 9 is printed and the conductor 16 is extended by a newly printed conductor 18 to a lead-out end $P_2$ at the right edge while the conductor is extended by an inverted-L-shaped conductor 19. In the step of FIG. 6, a magnetic layer 20 similar to the layer 14 is printed and one end of the conductor 19 is connected to another conductor 21 so printed as to terminate at a lead-out end $S_2$ at the left edge of the laminate. Finally, as illustrated in FIG. 7, an additional magnetic layer 21 is deposited by printing onto the entire surface to conclude the laminating operation. The resulting laminate is fired in a furnace for that use.

Figure 8:
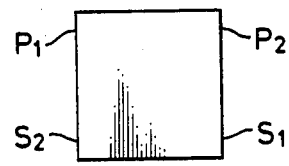
Figure 9:
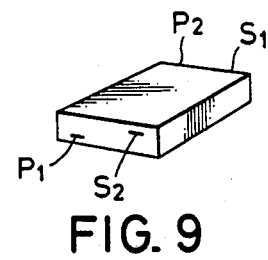
FIG. 9 is a perspective view of the completed transformer.

The fired laminate, as in FIGS. 8 and 9, has the lead-out ends $P_1$, $P_2$, $S_1$, $S_2$ exposed at its edges. Altogether, FIGS. 1 through 7 clearly indicate that the conductors connected into one from the end $P_1$ to the end $P_2$ constitute the primary winding and the conductors from the end $S_1$ to the end $S_2$ the secondary winding.

Figure 10:
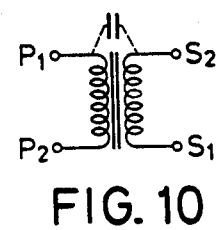
FIG. 10 is a circuit diagram of the laminated transformer.
Figure 11:
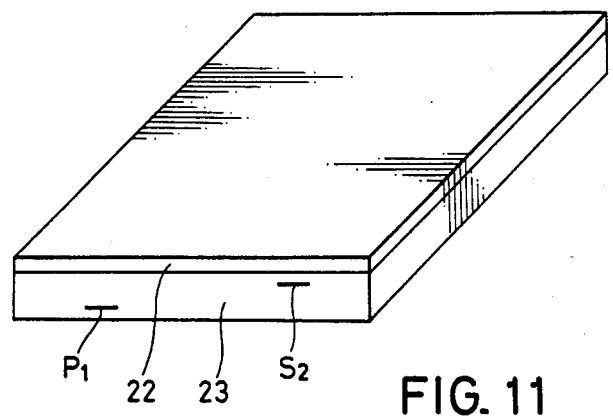
FIG. 11 is a perspective view of the laminated transformer with a glass undercoat or laminated capacitor deposited integrally thereon.

FIG. 10 is a circuit diagram of a laminated transformer thus fabricated. According to the necessity, as shown in FIG. 11, an undercoat of glass is baked onto this laminated transformer baseboard 23 or a laminated capacitor 22 (a laminate of alternate layers of electrode conductor and dielectric materials) is deposited in the form of successive layers thereon and fired together.

Figure 12:
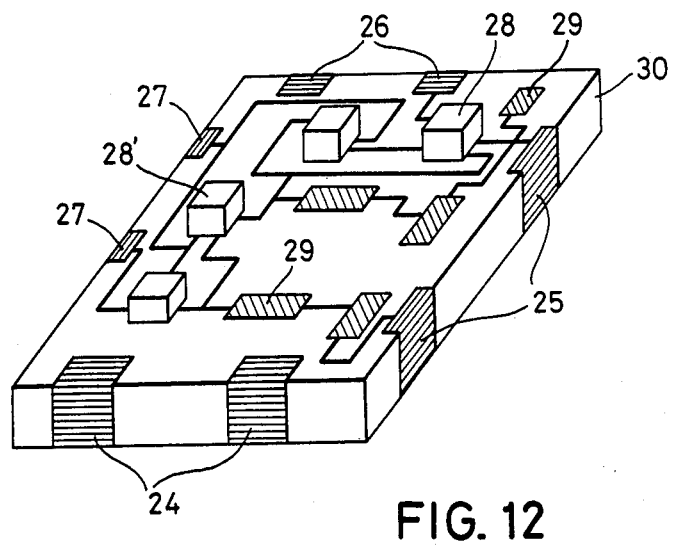
FIG. 12 is a perspective view of the laminated transformer complete with necessary electronic components attached thereto.
Figure 13:
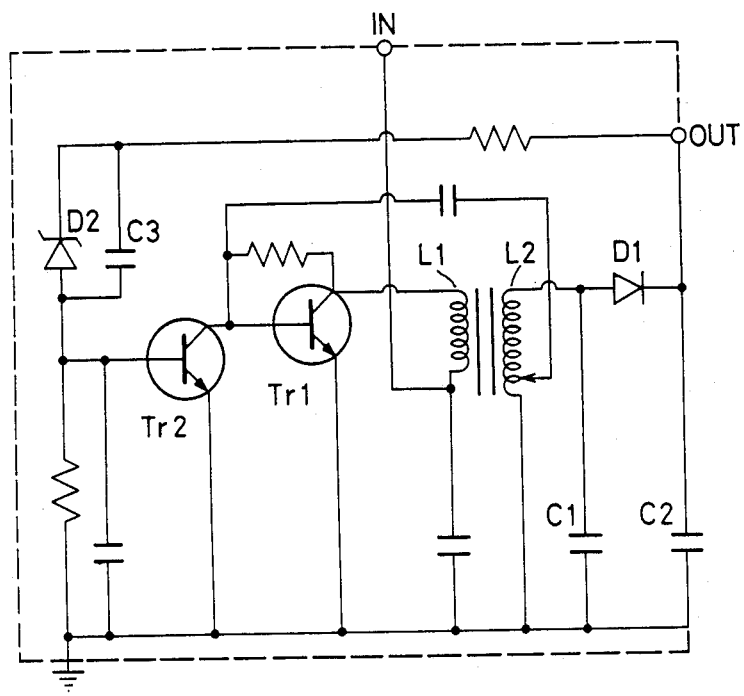
FIG. 13 is a circuit diagram of the completed DC-DC converter of the laminated, hybrid integrated type.

External terminals 24, 25, 26, 27, etc. are baked with conductive paste and secured to the edges to cover the conductor ends $P_1$, $P_2$, $S_1$, $S_2$, etc. Further, other discrete electronic devices (such as transistors 28, diodes 28', and resistors 27) are attached to the laminate surface by a usual integrated-circuit technique. FIG. 12 is a schematic view of the resulting structure with the necessary electronic parts mounted in position. FIG. 13 gives a circuit diagram of the character well-known in the art representing the laminated, hybrid integrated DC-DC converter completed in accordance with the invention.

From the foregoing description it should be obvious to those skilled in the art that the fabrication of the DC-DC converter according to the present invention is accomplished in a consistent, simplified operation by combining the known integrated circuit techniques and that the DC-DC converter manufactured in this way achieves marked reduction in size.

What is claimed is:

1. A DC-DC converter of a laminated hybrid integrated type comprised of a DC-DC converter including a transistor with the input connected to a DC input terminal and a transformer with its primary winding connected to the output of said transistor and its secondary winding to the input of said transistor to form an oscillator, an AC-DC converter operatively associated with said DC-AC converter and including a diode and capacitor network for rectifying and smoothing the output of the secondary winding, characterized in that said transformer consists of a sintered laminate formed by alternately laminating a plurality of insulator layers and two sets of conductor insulated from each other, said conductor layers being connected at ends so as to constitute said primary and secondary windings each spiralling upward in an interlayer formation from above one insulator layer to another, both ends of said windings being led to terminals on periphery of said sintered laminate, said transistor and said diode and capacitor network being mounted on the surface of said sintered laminate, the output and input of said transistor being connected to said terminals for the primary and second windings respectively, and the input of said diode and capacitor network being connected to the terminal for the output of said secondary winding.

2. A DC-DC converter according to claim 1, wherein said laminated transformer has a glass undercoat formed thereon.

3. A DC-DC converter of a laminated hybrid integrated type comprised of a DC-AC converter including a transistor with the input connected to a DC input terminal and a transformer with its primary winding connected to the output of said transistor and its secondary winding to the input of said transistor to form an oscillator, an AC-DC converter operatively associated with said DC-AC converter and including a diode and capacitor network including at least one capacitor for rectifying and smoothing the output of the secondary winding, characterized in that said transformer consists of a sintered laminate formed by alternately laminating a plurality of insulator layers and two sets of conductor layers being connected at ends so as to constitute said primary and secondary windings each spiralling upward in an interlayer formation from above one insulator layer to another, ends of said windings being led to terminals on periphery of said sintered laminate, a laminated capacitor network stacked together with said sintered laminate to form a composite laminate, said network including at least one of said capacitors for the rectification and smoothing and at least one other capacitor utilized in said DC-AC converter, said transistor, said diode and the remaining capacitors being mounted on said composite laminate and the output and input of said transistor being connected to said terminals for the primary and secondary windings respectively, and input of said diode and capacitor network being connected to the terminal for the output of said secondary windng.

* * * * *